US012564093B2

(12) United States Patent
Simpson et al.

(10) Patent No.: US 12,564,093 B2
(45) Date of Patent: Feb. 24, 2026

(54) SEMICONDUCTOR DEVICE

(71) Applicants:DYNEX SEMICONDUCTOR LIMITED, Lincoln (GB); ZHUZHOU CRRC TIMES SEMICONDUCTOR CO. LTD, Zhuzhou (CN)

(72) Inventors: Robin Adam Simpson, Lincoln (GB); Yangang Wang, Lincoln (GB)

(73) Assignees: DYNEX SEMICONDUCTOR LIMITED, Lincoln (GB); ZHUZHOU CRRC TIMES SEMICONDUCTOR CO. LTD, Zhuzhou (CN)

( * ) Notice: Subject to any disclaimer, the term of this patent is extended or adjusted under 35 U.S.C. 154(b) by 532 days.

(21) Appl. No.: 18/010,590

(22) PCT Filed: May 28, 2021

(86) PCT No.: PCT/EP2021/064432
§ 371 (c)(1),
(2) Date: Dec. 15, 2022

(87) PCT Pub. No.: WO2022/248066
PCT Pub. Date: Dec. 1, 2022

(65) Prior Publication Data
US 2023/0268240 A1 Aug. 24, 2023

(51) Int. Cl.
| | |
|---|---|
| *H01L 21/52* | (2006.01) |
| *H01L 23/00* | (2006.01) |
| *H01L 23/051* | (2006.01) |
| *H01L 23/367* | (2006.01) |
| *H01L 23/473* | (2006.01) |
| *H01L 23/544* | (2006.01) |
| *H01L 25/07* | (2006.01) |

(52) U.S. Cl.
CPC ............ *H01L 23/051* (2013.01); *H01L 21/52* (2013.01); *H01L 23/3675* (2013.01);
(Continued)

(58) Field of Classification Search
None
See application file for complete search history.

(56) References Cited

U.S. PATENT DOCUMENTS

| | | | |
|---|---|---|---|
| 4,399,452 | A | 8/1983 | Nakashima et al. |
| 9,559,027 | B2 | 1/2017 | Kuwahara |
| | | (Continued) | |

FOREIGN PATENT DOCUMENTS

| | | | |
|---|---|---|---|
| DE | 202015102948 U1 | 7/2015 | |
| EP | 3252809 A1 | 12/2017 | |
| | | (Continued) | |

OTHER PUBLICATIONS

International Search Report and Written Opinion issued in connection with corresponding PCT Patent Application No. PCT/EP2021/064432 dated Feb. 28, 2022.

*Primary Examiner* — Brent A. Fairbanks
*Assistant Examiner* — Michael Anguiano
(74) *Attorney, Agent, or Firm* — Tarolli, Sundheim, Covell & Tummino LLP

(57) ABSTRACT

There is provided a semiconductor device 1, comprising: a housing comprising a housing electrode 4; and at least one semiconductor chip 20 arranged within the housing; wherein the housing electrode 4 comprises a deformable portion 15, and the deformable portion 15 is configured to deform when a pressure difference between an interior and an exterior of the housing exceeds a threshold differential pressure or a temperature at the deformable portion exceeds a threshold temperature, so as to transform the housing from a hermetically sealed housing to an open housing in fluid communication with the exterior.

19 Claims, 3 Drawing Sheets

(52) U.S. Cl.
CPC ............ *H01L 23/544* (2013.01); *H01L 24/29*
(2013.01); *H01L 24/32* (2013.01); *H01L 24/33*
(2013.01); *H01L 25/072* (2013.01); *H01L*
*2223/54426* (2013.01); *H01L 2223/54486*
(2013.01); *H01L 2224/29139* (2013.01); *H01L*
*2224/32245* (2013.01); *H01L 2224/33181*
(2013.01)

(56) References Cited

U.S. PATENT DOCUMENTS

| | | | | |
|---|---|---|---|---|
| 9,818,705 B1 * | 11/2017 | Kuwahara | ............. | H01L 23/047 |
| 2007/0224817 A1 * | 9/2007 | Honda | ............. | H01J 37/32082 |
| | | | | 700/121 |
| 2012/0043662 A1 * | 2/2012 | Ohno | ...................... | H01L 24/49 |
| | | | | 257/773 |
| 2015/0069589 A1 * | 3/2015 | Kamata | ............. | H01L 23/49575 |
| | | | | 257/666 |
| 2016/0247736 A1 * | 8/2016 | Kuwahara | ............... | H01L 23/18 |

FOREIGN PATENT DOCUMENTS

| | | | | | |
|---|---|---|---|---|---|
| JP | S54-25165 A | 2/1979 | | | |
| JP | 2018046190 A | 3/2018 | | | |
| WO | WO-2015172956 A1 * | 11/2015 | ........... | H01L 23/051 | |
| WO | 2016184590 A1 | 11/2016 | | | |

* cited by examiner

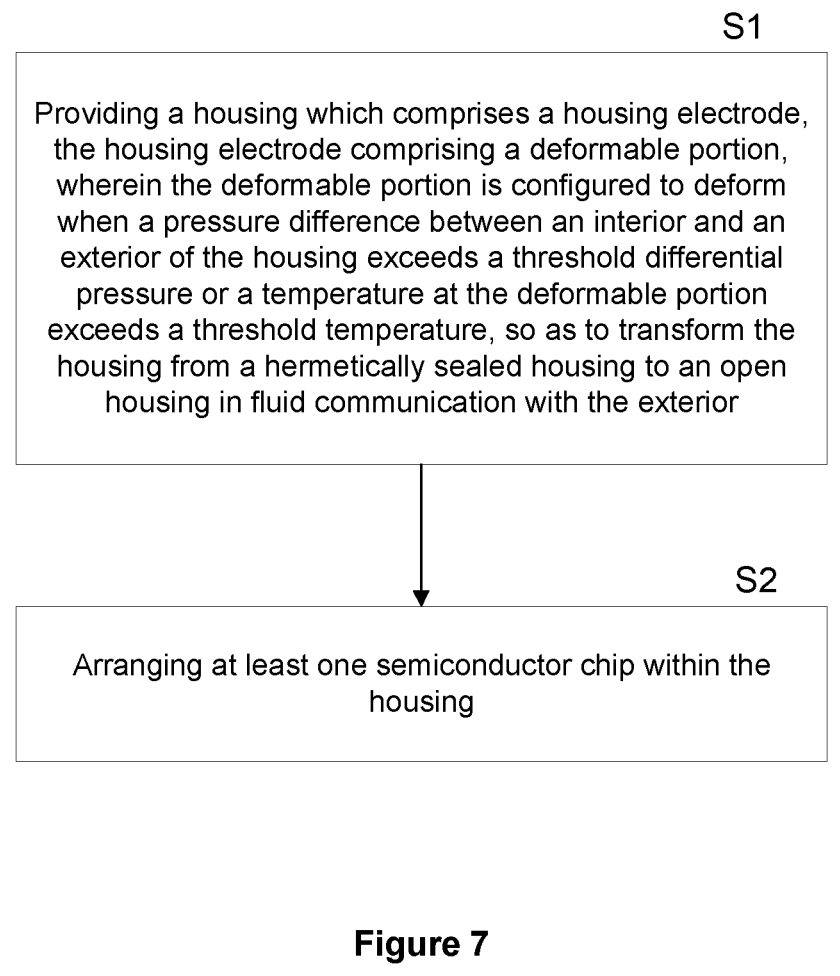

S1

Providing a housing which comprises a housing electrode, the housing electrode comprising a deformable portion, wherein the deformable portion is configured to deform when a pressure difference between an interior and an exterior of the housing exceeds a threshold differential pressure or a temperature at the deformable portion exceeds a threshold temperature, so as to transform the housing from a hermetically sealed housing to an open housing in fluid communication with the exterior

S2

Arranging at least one semiconductor chip within the housing

Figure 7

SEMICONDUCTOR DEVICE

RELATED APPLICATIONS

The present invention is a U.S. National Stage under 35 USC 371 patent application, claiming priority to PCT Application No. PCT/EP2021/064432, filed on May 28, 2021; the entirety of which is hereby incorporated herein by reference.

TECHNICAL FIELD

The present disclosure relates to a semiconductor device. More particularly, but not exclusively, the present disclosure relates to a power semiconductor device having an improved failure mode.

BACKGROUND

A power semiconductor device may house one or more power semiconductor chips (or dies). The power semiconductor chips are often used to switch high currents and voltages, and may include one or more of a power transistor, a power diode, and a thyristor, etc. A power transistor includes, but is not limited to, a power metal-oxide-semiconductor field effect transistor (MOSFET), a power bipolar junction transistor (BJT), and an insulated gate bipolar transistor (IGBT), etc. A thyristor includes, but is not limited to, an integrated gate-commutated thyristor (IGCT), and a gate turn-off thyristor (GTO), etc. The power semiconductor device may also be referred to as a power module or a power electronic module.

It is common for a power semiconductor device to have a hermetic package. The hermetic package provides a hermetically sealed housing (or case) which encloses an internal space, and one or more power semiconductor chips are arranged within the internal space of the housing. The hermetic package is often filled with an inert gas (e.g., nitrogen) to prevent moisture, dust particles and/or other foreign particles from entering the package, thereby ensuring normal operation of the chips. The terms "housing" and "case" are used interchangeably below.

FIG. 1 schematically illustrates a sectional view of a known power semiconductor device 100 which has a press-pack package. The press-pack package is typically a hermetic package. Press-pack power semiconductor devices are an alternative to traditional isolated-base power semiconductor devices, in which power semiconductor chips are typically soldered on isolated substrates that carry the chips respectively and are also wire-bonded to the substrates. Instead of the wire bonds and solder joints used in isolated-base devices, press-pack devices typically rely on the application of force by an external clamping system, to make contact to the chips.

As shown in FIG. 1, the press-pack power semiconductor device 100 comprises a plurality of semiconductor chips 120. Individual semiconductor chips 120 are connected in parallel within a single pressure contact housing to produce a single device containing multiple chips with a current handling capability that is ideally the sum of the capability of all the chips contained within the housing. The semiconductor chips 120 are placed between mechanical strain buffers 102, 103 to form semiconductor units 130. These semiconductor units 130 are then positioned between upper and lower electrodes 104, 105 in a hermetically-sealed housing which is formed by the electrodes 104, 105, a ceramic tube 108 and thin flanges 106, 107, 109. The thin flanges include a lid flange 106, a housing upper flange 107, and a housing lower flange 109. The thin flanges 106, 107, 109 make a gas-tight, flexible joint between the electrodes 104, 105 and the ceramic tube 108. The hermetically-sealed housing encloses an internal space 111. The internal space 111 is commonly filled with nitrogen.

It is typical that one electrode (e.g., the upper electrode 104) is flat and the other (e.g., the lower electrode 105) has an array of pillars 110 formed on its inner surface. The semiconductor units 130 typically have upper and lower contact regions of differing areas. As shown in FIG. 1, the pillars 110 of the lower electrode 105 permit contact to the smaller area at the bottom surfaces of the chips 120.

Power semiconductor devices with hermetic cases are vulnerable to uncontrolled case ruptures in the event of excessive internal gas pressure. Internal gas pressure may be increased to critical levels by events such as a high energy discharge from local energy storage or continued operation in a state known as short-circuit failure mode.

High energy discharge may occur if a power semiconductor device fails and loses its ability to withstand high voltage. Commonly, power semiconductor devices are connected in circuits containing very large capacitors capable of storing tens of kilojoules of electrical energy to form an electrical system. During operation of the system, the voltage across the capacitors is maintained at a high level. This is enabled by the high voltage blocking capability of the devices. In the event of failure of a device, its high voltage blocking capability is lost and the energy from the capacitor(s) is discharged very rapidly in the form of a high electrical current, typically over the course of a few tens of microseconds. When a device (e.g., the device 100) fails, it does so initially at a single point (e.g., a single one of the chips 120). This point assumes a low impedance state relative to the rest of the device. Electrical current would follow the path of least resistance and therefore tends to flow through the failure point. In the event of a high energy discharge, the high current density at this point leads to rapid and excessive heating causing melting and thermal decomposition of adjacent components and the generation of high pressure within the internal space (e.g., the space 111) of the hermetically-sealed case. If the high pressure exceeds the pressure withstand capabilities of the case, then the case will rupture, often in an unpredictable manner.

In a system with in-built redundancy (i.e., the number of devices used exceeds the minimum required), if a failed device withstands the initial high energy discharge event, it is often required to operate in what is known as the short-circuit failure mode for an extended period of time, typically until the next scheduled maintenance of the system, which may occur at intervals of one year or more. In the short-circuit failure mode, the failed device must achieve and maintain a low impedance state approximating a short circuit to enable continued operation of the system as a whole. In this state, the load current for the system is typically conducted through a small area in the failed device, such as a single failed chip. This leads to the generation of high local temperatures within the case of the device. The high temperatures not only increase the pressure of gas (e.g., nitrogen) within the housing, but may also cause thermal decomposition of polymeric components, generating additional gases and further increasing internal pressure. If the internal gas pressure exceeds the withstand capability of the case, then, as for the high energy discharge event, the case may rupture in an unpredictable manner.

Case rupture of a power semiconductor device is hazardous for both neighbouring equipment and personnel due to emission of high temperature gases and ejection of debris including metals and ceramics, among other materials. In applications where uncontrolled case rupture cannot be tolerated, additional safety measures such as enclosures or shielding are often provided. Those measures incur additional costs which may not be acceptable.

It is preferable that case rupture of a power semiconductor device is controlled in a predictable manner so as to reduce the danger of explosive destructions caused by the failure of the device. Known techniques typically involve the use of a rupture disk (or a fragile portion) in the hermetic case of the power semiconductor device. The rupture disk would remain sealed during normal operation of the device, but would break open in the event of high pressure or high temperature generated during the failure mode described above. In particular, two existing designs are known.

The first design is described in WO 2015/172956 A1 and U.S. Pat. No. 9,559,027 B2. In this design, a rupture disk with a lower resistance to a pressure increase or a temperature increase than the rest of the case is formed in the wall of the ceramic tube 108. Since the rupture disk is more sensitive to pressure increase and/or temperature increase than the rest of the case, rupture would occur preferentially at this location.

The second design is described in WO 2015/172956 A1 and US 2015/0069589 A1. In this design, a rupture disk is formed in the thin flange material (e.g., the lid flange 106) that connects a housing electrode to the ceramic tube 108. As for the first design, overpressure or over-temperature is expected to cause the rupture disk to break open before uncontrolled explosive rupture of the device's case occurs.

In the known designs, once the rupture disk breaks open, the rupture disk establishes a fluid communication path between the internal space 111 of the case and an exterior of the case (e.g., the ambient air). Thus, the case of the device would no longer be hermetically sealed. Gases and explosion debris can leave the case via the rupture disk. In this way, overpressure within the case is relieved and guided to the outside of the case in a controller manner.

A disadvantage of the known designs is that it is generally difficult to reliably direct hot gases and debris emitted through the rupture disks to elsewhere, and thus hot gases and debris would be directly emitted from the case to the surrounding area, thereby causing safety concerns to neighbouring equipment and personnel.

Another way to mitigate the danger caused by case rupture of a power semiconductor device is to improve the rupture resistance of the case. Known techniques involve the use of protective shield(s) within the case to obstruct the path of hot gases and explosion debris between the failure location and the inside surfaces of the ceramic tube 108 and the thin flanges 106, 107, 109. The protective shields are typically manufactured from insulating materials such as ceramics and polymers or a mixture thereof. DE 202015102948 U1, U.S. Pat. No. 4,399,452 A, JP S54-25165 A and WO 2016/184590 A1 disclose various examples of the protective shields.

The materials of the protective shields are not ideal. In particular, protective shields made of polymers may help to prevent explosive case rupture up to some level of energy, but they may at the same time increase the level of pressure cumulated inside of the case. This is because polymers will undergo thermal decomposition at the high temperatures experienced during the short-circuit failure mode, and the thermal decomposition increases the internal gas pressure inside the sealed case. Therefore, in case the overpressure exceeds a critical value, protective shields made of polymers have only limited effects.

Ceramic materials are typically brittle and are difficult to manufacture to precise dimensions by mass production techniques with acceptable costs. Therefore, protective shields made of ceramics typically require a wide dimensional tolerance. Further, the ceramic shields need to be relatively thick to resist fracture. Therefore, sufficient additional space is required in the housing to accommodate the ceramic shields.

Limited metal shields have also been used, but they are typically employed simply to provide shielding for the flanges (e.g., the flanges 106, 107, 109) of the housing, not the ceramic tube 108. Shielding for the ceramic tube 108 is still provided using polymers.

Another disadvantage of using the protective shields is that the high pressure would stay inside the hermetically sealed case of the failed device, and accordingly there is a danger of a malfunction and an undefined degassing in later manipulation stage with the failed device.

It is an object of the present disclosure, among others, to provide a semiconductor device with an improved failure mode, which solves problems associated with known semiconductor devices, whether identified herein or otherwise.

SUMMARY

According to an aspect of the present disclosure, there is described a semiconductor device, comprising: a housing comprising a housing electrode; and at least one semiconductor chip arranged within the housing; wherein the housing electrode comprises a deformable portion, and the deformable portion is configured to deform when a pressure difference between an interior and an exterior of the housing exceeds a threshold differential pressure or a temperature at the deformable portion exceeds a threshold temperature, so as to transform the housing from a hermetically sealed housing to an open housing in fluid communication with the exterior.

In other words, the deformable portion has an original intact condition and a deformed condition. During the intact condition, the housing is hermetically sealed. During the deformed condition, the deformable portion provides a fluid communication path (e.g., an opening) between the interior and the exterior of the housing. In the event of failure of the semiconductor device, extreme heating within the device may lead to an increase in the internal gas pressure of the housing, and/or an increase in the temperature around the housing. The pressure increase or the temperature increase, once exceeding a respective threshold value, would cause the deformable portion to deform. The deformation of the deformable portion breaks the hermetic seal of the housing and relieves the overpressure inside the housing, thereby reducing the risks of explosive rupturing of the housing.

As compared to providing the deformable portion in other locations of the housing, providing the deformable portion in the housing electrode allows hot gases emitted from the interior of the housing to be easily cooled down before the gases are released to the surrounding area, thereby rendering the emitted gases less hazardous. This may be achieved by, for example, re-using an existing assembly component which is commonly associated with the housing electrode.

Further, providing the deformable portion in the housing electrode allows a user to easily and conveniently guide the gases emitted from the interior of the housing to a desired location/direction before the gases are released to the surrounding area. Therefore, the final point of gas ejection into the surrounding area may be suitably designed to differ from the particular location of the deformable portion, such that no danger or only a significantly reduced danger is presented by the semiconductor device to the surrounding area. This greatly expands a user's options with regard to handling the emitted gases.

Therefore, by providing the deformable portion in the housing electrode, the semiconductor device has an improved failure mode.

The term "deform" or "deformable" covers any type of deformation of the deformable portion which allows the housing to be in fluid communication with its exterior. For example, it covers at least rupturing, melting, bursting and/or shattering of the deformable portion.

The at least one semiconductor chip may be electrically and thermally coupled to the housing electrode.

The deformable portion may have a resistance to at least one of a pressure increase and a temperature increase that is less than other portions of the housing.

In other words, the deformable portion is a fragile portion, and would tend to break open before other portions of the housing due to a pressure/temperature increase. Consequentially the housing may break at the localized deformable portion upon being subjected to an increased pressure/temperature.

The interior of the housing may comprises an inert gas prior to a deformation of the deformable portion. The inert gas may comprise nitrogen.

The deformable portion may have a circular disk shape.

The deformable portion may have a thickness which is less than other portions of the housing electrode. The deformable portion may have a thickness of at least about 0.3 mm.

The deformable portion may be made of the same material as other portions of the housing electrode. The deformable portion may be made of metal (e.g., copper).

The deformable portion may be an integral part of the housing electrode. The deformable portion may be formed by applying a material removal process on the housing electrode.

The deformable portion may be attached to other portions of the housing electrode, by, for example, brazing, soldering or welding. Alternatively, the deformable portion may be attached to other portions of the housing electrode via an additional structure (e.g., a frame).

The deformable portion may be arranged at the centre of (a surface of) the housing electrode. Advantageously, this arrangement allows the deformable portion to be within a reasonable distance to each of the at least one semiconductor chip, thereby allowing the deformable portion to react at a reasonable speed to a fault of any chip.

The housing electrode may comprise an inner surface facing the interior of the housing, and an opposing outer surface, and wherein the outer surface comprises a hole, the deformable portion being arranged between the hole and the interior of the housing.

In other words, the hole has an opening to the outer surface of the housing electrode but does not extend completely through the housing electrode. The deformable portion acts as a bottom wall of the hole. This arrangement allows the deformable portion to have a thickness which is less than other portions of the housing electrode, and thus to have a less resistance to pressure/temperature increase than other portions of the housing electrode.

Further, as compared to forming the hole at the inner surface of the housing electrode, forming the hole at the outer surface of the housing electrode allows the deformable portion to stay closer to the at least one chip and thus to react faster in the event of a fault of the semiconductor device.

Forming the hole at the outer surface of the housing electrode also allows the hole to be used as a mounting hole.

The inner surface of the housing electrode may be a flat surface.

The hole may be configured as a mounting hole for aligning the semiconductor device with an assembly component associated with the semiconductor device. Advantageously, the hole is adapted for dual use as both an aligning aid and a vent for the release of hot gases from the interior of the housing. The assembly component may comprise a heat sink or a bus bar.

The hole may be arranged at the centre of the outer surface of the housing electrode. This arrangement allows the hole to be used as an aligning aid for aligning the centre of the semiconductor device with the centre of the assembly component, thereby maintaining even pressure between the semiconductor device and the assembly component.

The housing electrode may comprise more than one deformable portion.

The outer surface of the housing electrode may further comprise a groove extending from the hole to a periphery of the housing electrode.

Advantageously, the hole and the groove collectively provide a gas guiding channel, which can be used to direct hot gases emitted from the interior of the housing to a suitable location at the periphery of the housing electrode. A path of the groove on the outer surface of the housing electrode would determine an exit path/direction of the emitted gas into the surrounding area. The path of the groove may be suitably designed to reduce the danger presented by the emitted gas to the surrounding area. Further, the path of the groove may wind around the hole on the outer surface so as to more efficiently cool the emitted gas before it is released to the surrounding area.

The housing electrode may be referred to as a first housing electrode, and the housing may further comprise a second housing electrode and an electrical insulator arranged between the first and second housing electrodes, wherein the first and second housing electrodes are located at opposite sides of the housing.

The second housing electrode may comprise a further deformable portion.

The at least one semiconductor chip may be arranged between the first and second housing electrodes, and may be electrically coupled to one or more of the first and second housing electrodes. Further, the at least one semiconductor chip may be thermally coupled to one or more of the first and second housing electrodes.

The term "electrically coupled" includes that one or more intervening element(s) adapted for electrical conduction may exist between the electrically coupled elements. Similarly, the term "thermally coupled" includes that one or more intervening element(s) adapted for thermal conduction may exist between the thermally coupled elements.

The electrical insulator may have a tubular shape and surround the at least one semiconductor chip.

The housing may further comprise a first flange connecting the first housing electrode with the electrical insulator, and a second flange connecting the second housing electrode with the electrical insulator.

The semiconductor device may further comprise a first strain buffer arranged between the at least one semiconductor chip and the first housing electrode.

The semiconductor device may further comprise a second strain buffer arranged between the at least one semiconductor chip and the second housing electrode.

The semiconductor device may be a power semiconductor device, and the at least one semiconductor chip may comprise at least one power semiconductor chip.

According to a second aspect of the present disclosure, there is described a system comprising: a semiconductor device according to the first aspect; and an assembly component arranged at the exterior of the semiconductor device in the vicinity of the housing electrode of the semiconductor device.

The assembly component may be arranged to contact at least a part of an outer surface of the housing electrode.

The assembly component and the housing electrode may be configured such that gas emitted from the interior to the exterior of the housing follows a path which leads through the deformed deformable portion and passes between the assembly component and the housing electrode.

Advantageously, by allowing the emitted gas to pass between the assembly component and the housing electrode, the hot gas can be effectively cooled down before it is released to the surrounding area of the system, thereby rendering the gas less hazardous.

The assembly component may comprise a first surface facing the semiconductor device, the first surface comprising a groove extending from the hole (of the housing electrode) to a periphery of the assembly component.

Therefore, the hole and the groove collectively provide a gas guiding channel for directing the gas emitted from the interior of the housing to the surrounding area. Advantageously, a path of the groove on the first surface of the assembly component would determine an exit path/direction of the emitted gas into the surrounding area. The path of the groove may be suitably designed to reduce the danger presented by the emitted gas to the surrounding area. Further, the groove may wind around the hole on the first surface so as to more efficiently cool the emitted gas before it is released to the surrounding area.

The system may further comprise a tube, at least a part of which is located within the hole.

Advantageously, the tube may be adapted for dual use as both an aligning tool for aligning the semiconductor device with the assembly component, and a gas guiding tool for guiding the gas emitting from the interior of the housing to the surrounding area.

The tube may be configured to direct gas emitted from the interior of the housing to flow, along a predetermined direction or path, between the assembly component and the housing electrode.

Advantageously, the tube guides the emitted gas to the outside of the semiconductor device in a very controlled and defined manner. The predetermined direction or path of the gas stream may be suitably chosen such that a significantly reduced danger is presented to the surrounding area of the system.

The tube may comprise a side wall and an opening extending through the side wall, and wherein the opening is positioned to allow gas emitted from the interior of the housing to flow, via the opening, into an interface between the assembly component and the housing electrode.

The tube may be configured to pass through the hole (of the housing electrode) and the groove of the assembly component.

Alternatively, the tube may be configured to pass through the hole and the groove of the housing electrode.

Advantageously, he tube may extend from the deformable portion to the periphery of the assembly component and/or the housing electrode, thereby effectively channeling hot gases emitted from the interior of the housing to a suitable location at the periphery of the assembly component and/or the housing electrode.

The assembly component may comprise a heat sink. The heat sink may be a water-cooled heat sink.

Further or alternatively, the assembly component may comprise a bus bar.

The semiconductor device may be a power semiconductor device, and the system may be a power electronics system.

According to a third aspect of the present disclosure, there is described a method of manufacturing a semiconductor device. The method comprises: providing a housing, wherein the housing comprises a housing electrode; and arranging at least one semiconductor chip within the housing; wherein the housing electrode comprises a deformable portion, and the deformable portion is configured to deform when a pressure difference between an interior and an exterior of the housing exceeds a threshold differential pressure or a temperature at the deformable portion exceeds a threshold temperature, so as to transform the housing from a hermetically sealed housing to an open housing in fluid communication with the exterior.

Where appropriate any of the optional features described above in relation to one of the aspects of the present disclosure may be applied to another one of the aspects of the disclosure.

The term "about" or "approximately" used in the present disclosure indicate a degree of variability (e.g., 20%) in stated numerical values.

BRIEF DESCRIPTION OF THE DRAWINGS

In order that the disclosure may be more fully understood, a number of embodiments of the disclosure will now be described, by way of example, with reference to the accompanying drawings, in which:

FIG. 7 schematically illustrates processing steps of a method for manufacturing a semiconductor device;

In the figures, like parts are denoted by like reference numerals.

It will be appreciated that the drawings are for illustration purposes only and are not drawn to scale.

DETAILED DESCRIPTION OF THE PREFERRED EMBODIMENTS

Figure 1:
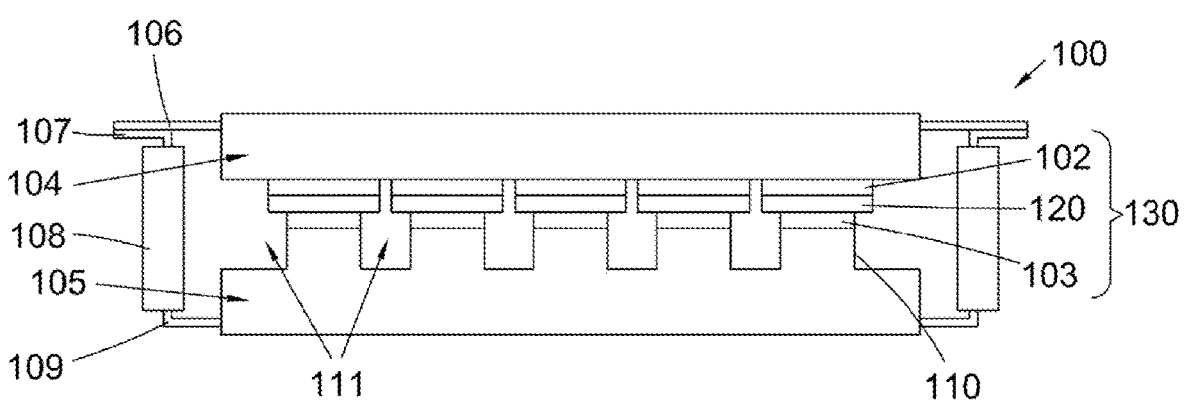
FIG. 1 is a schematic representation of a known semiconductor device.
Figure 2:
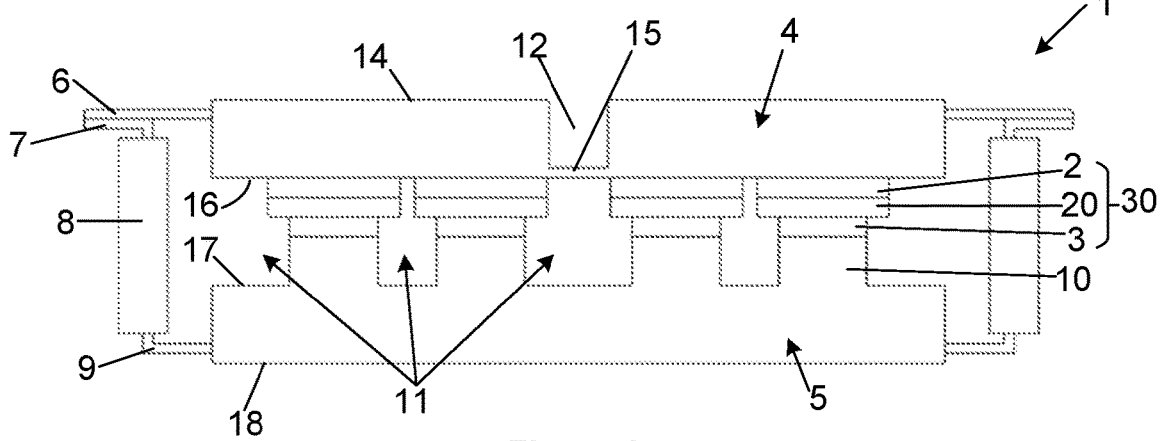
FIG. 2 schematically illustrates a sectional view of a semiconductor device according to a first embodiment of the present disclosure.
Figure 3:
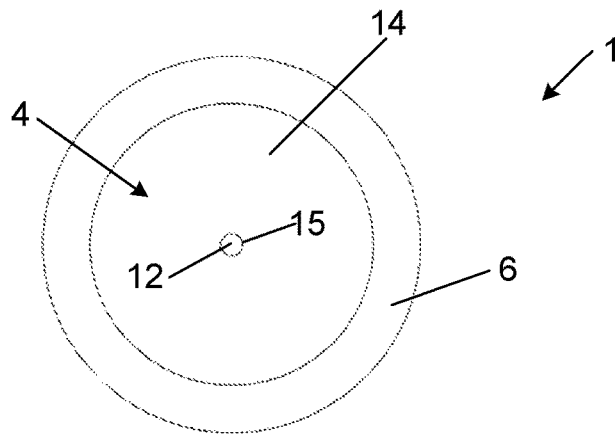
FIG. 3 schematically illustrates a plan view of the semiconductor device of FIG. 2.

FIG. 2 schematically illustrates a cross sectional view of a semiconductor device 1 (referred to as the "device" below) according to a first embodiment of the present disclosure. In this example, the semiconductor device 1 is embodied as a multi-chip press-pack power semiconductor device. FIG. 3 illustration a top plan view of the device 1.

As shown in FIG. 2, the device 1 comprises an upper housing electrode 4, a lower housing electrode 5, upper strain buffers 2, lower strain buffers 3, and a plurality of power semiconductor chips 20 (referred to as the "chips" below). The upper strain buffers 2 and the lower strain buffers 3 are arranged at opposite surfaces of the chips 20. The housing electrodes 4, 5 are typically made of copper. The upper strain buffers 3 and the lower strain buffers 4 are typically made of molybdenum. The power semiconductor chips 20 may be made in silicon technology, or alternatively may be based upon other types of semiconductors, such as, silicon carbide, gallium nitride, or silicon germanium etc. The chips 20 may comprise one or more of a power transistor (e.g., an IGBT, a power MOSFET, a power BJT), a power diode, and a power thyristor (e.g., an IGCT, a GTO) etc.

During operations of the device 1, the device 1 heats and cools, and consequently each component of the device 1 undergoes thermal expansion and contraction. Difference in the thermal expansion coefficients of adjacent components leads to abrasive wear (also called "fretting") of their contact surfaces. The thermal expansion coefficients of silicon and molybdenum are more closely matched than those of silicon and copper. The strain buffers 2, 3 are useful for reducing the rate of wear on the surfaces of the chips 20. The chips 20 may be silver sintered (or otherwise bonded) to the strain buffers 2, 3 to further reduce the risks of fretting and reduce the thermal resistance of the chips 20. A combination of a single chip 20 with its associated strain buffers 2, 3 may be referred to as a semiconductor unit 30. It would, however, be appreciated that the strain buffers 2, 3 may be wholly or partly omitted from the semiconductor units 30.

The device 1 further includes a lid flange 6, a housing upper flange 7, an electrical insulator 8, and a housing lower flange 9. These components form a gas-tight (or hermetic) connection between the upper housing electrode 4 and the lower housing electrode 5. The housing electrodes 4, 5, the flanges 6, 7, 9 as well as the electrical insulator 8 together form a hermetic housing of the device 1. The housing encloses an internal space 11 which is typically filled with an inert gas (e.g., nitrogen) at a suitable pressure (e.g., approximately one standard atmospheric pressure) to ensure reliable operation of the chips 20. While FIG. 2 shows that the internal space 11 includes separate sections located at opposite sides of each semiconductor unit 30, it would be understood that the separate sections are in fact interconnected in the third dimension relative to the cross-sectional plane of FIG. 2. The lid flange 6 and the housing upper flange 7 connect the upper housing electrode 4 with the electrical insulator 8. The housing lower flange 9 connects the lower housing electrode 5 with the electrical insulator 8.

The electrical insulator 8 electrically isolates the upper housing electrode 4 from the lower housing electrode 5. The electrical insulator 8 may have a tubular or cylindrical shape and comprises an electrically insulating material (e.g., ceramic). It would be appreciated that the electrical insulator 8 may comprise electrically conductive material(s) as far as the electrically conductive material(s) do not form a conducting path between the electrodes 4, 5. The electrical insulator 8 typically surrounds the semiconductor units 30. The flanges 6, 7, and 9 may be made of copper or nickel-iron.

The upper housing electrode 4 comprises an inner surface 16 facing the semiconductor units 30 and an outer surface 14 opposite to the inner surface 16. The lower housing electrode 5 comprises an inner surface 17 facing the semiconductor units 30 and an outer surface 18 opposite to the inner surface 17. The outer surfaces 14, 18 are exposed to an exterior of the device 1. The lower housing electrode 5 further comprises an array of pillars 10 extending from its inner surface 17 into the internal space 11 of the housing. The pillars 10 form contacts with the lower strain buffers 3. Dry interfaces may exist between the semiconductor units 30 and the upper housing electrode 4, and/or between the semiconductor units 30 and the pillars 10. By clamping the semiconductor units 30 between the housing electrodes 4, 5, the chips 20 are electrically and thermally coupled to the housing electrodes 4, 5. In particular, upper sides of the chips 20 are electrically and thermally coupled to the upper housing electrode 4. Lower sides of the chips 20 are electrically and thermally coupled to the lower housing electrode 5.

With further reference to FIGS. 2 and 3, the upper housing electrode 4 has a deformable portion 15 formed therein. The deformable portion 15 is designed to deform (e.g., rupture or melt) when a pressure difference between the interior and the exterior of the housing exceeds a threshold differential pressure or a temperature at the deformable portion 15 exceeds a threshold temperature. Further, the deformable portion 15 is designed to have a locally low resistance to at least one of a pressure increase and a temperature increase that is lower than other portions of the upper housing electrode 4 as well as other structures of the housing. In other words, the deformable portion 15 is a fragile portion. A pressure increase or a temperature increase causes the deformable portion 15 to transition from an original intact condition to a deformed condition.

During the original intact condition of the deformable portion 15 as shown in FIG. 2, the housing of the device 1 is hermetically sealed. During the deformed condition of the deformable portion 15 (not shown), the deformable portion 15 provides an opening which serves as a fluid communication path between the interior and the exterior of the housing. Therefore, the housing of the device 1 is no longer hermetically sealed when the deformable portion 15 is deformed, and becomes an open housing in fluid communication with the exterior.

In the event of failure of the device 1, extreme heating within the device 1 may lead to an increase in the internal gas pressure of the housing, and/or an increase in the temperature around the housing. The pressure increase or the temperature increase, once exceeding a respective threshold value, would cause the deformable portion 15 to deform. The deformation of the deformable portion 15 connects the interior of the housing to the exterior, thereby relieving the pressure built-up inside the housing. Therefore, the use of the deformable portion 15 provide an effective and reliable measure to allow a pressure release before the pressure inside the housing exceeds a dangerous value, and accordingly significantly reduces the danger of an explosive rupturing of the housing.

In an example, the deformable portion 15 may have a low resistance against pressure. That is, the deformable portion 15 tends to rupture before other portions of the housing due to pressure increases. For instance, the deformable portion 15 may have a circular disc shape, and the thickness of the deformable portion 15 may be less than other portions of the upper housing electrode 4 (as shown in FIG. 2). The dimension of the deformable portion 15 may depend upon the required threshold differential pressure. By increasing the diameter of the deformable portion 15 and/or reducing the thickness of the deformable portion 15, the deformable portion 15 would rupture at a lower threshold differential pressure. It is desirable for the deformable portion 15 to have a sufficient thickness (typically at least 0.3 mm) which allows the deformable portion 15 to be handled during manufacture with a reduced risk of premature damage.

It would be appreciated that the resistance of the deformable portion 15 against pressure would allow the deformable portion 15 to remain intact during the manufacturing process of the device 1 and during the normal operation of the device 1, by considering typical differential pressures between the interior and the exterior of the housing that may exist in service. For example, during the manufacture of the device 1, the internal space 11 of the housing may be filled with nitrogen to achieve an internal pressure of approximately one standard atmospheric pressure at an ambient temperature of 25° C. At this time, the differential pressure across the deformable portion 15 is approximately zero. During the normal operation of the device 1, the device 1 may have a typical operating temperature of 125° C., and due to the temperature rise, the differential pressure between the interior and the exterior of the housing may rise to approximately 0.35 times the standard atmospheric pressure. Therefore, the threshold differential pressure at which the deformable portion 15 deforms must be higher than 0.35 times the standard atmospheric pressure. Further, during the manufacturing process, the hermetic seal of the housing may be checked by placing the device 1 in a high pressure vessel comprising Helium, followed by detecting the existence of Helium within the housing. Accordingly, the threshold differential pressure at which the deformable portion 15 deforms must be higher than the pressure difference across the deformable portion 15 when the device 1 is placed within the high pressure vessel.

Therefore, the manufacturing process and the normal operation of the device 1 define the lower limit of the threshold differential pressure of the deformable portion 15.

On the other hand, the resistance of the deformable portion 15 against pressure would not exceed the pressure withstand capability of the housing of the device 1. This allows the deformable portion 15 to break open so as to relieve the pressure of the housing, before the housing of the device 1 explosively ruptures, The pressure withstand capability of the hermetic housing may be established by testing and/or finite element simulation techniques. For example, if the pressure withstand capability of the housing of the device 1 is a critical differential pressure of 10 times the standard atmospheric pressure, then the threshold differential pressure at which the deformable portion 15 deforms must be lower than 10 times the standard atmospheric pressure.

Therefore, the pressure withstand capability of the housing of the device 1 defines the upper limit of the threshold differential pressure of the deformable portion 15.

Generally speaking, the threshold differential pressure of the deformable portion 15 may be any value within a range between the lower limit and the upper limit described above. It is however preferable that the threshold differential pressure of the deformable portion 15 is close to the lower limit of the range, so as to allow the deformable portion to quickly respond in the event of a fault within the device 1.

Alternatively, the deformable portion 15 may be relatively more susceptible to temperature increases than the other portions of the housing. That is, the deformable portion may, for example, melt at a lower temperature than the other portions of the housing. The threshold temperature which causes the deformable portion 15 to melt may be determined by the material of the deformable portion 15 as well as the thickness of the deformable portion 15. For instance, the deformable portion 15 may be made of a material which has a lower melting point than the material of other portions of the housing, and/or the deformable portion 15 may have a thickness which is less than other portions of the housing. It would be understood that the threshold temperature would be higher than the maximal temperature occurring at the deformable portion 15 during the manufacture and normal operation of the device 1 (i.e., the lower limit), and lower than the critical temperature at the deformable portion immediately before the explosive rupturing of the housing of the device 1 (i.e., the upper limit). Similarly, it is preferable that the threshold temperature is close to the lower limit so as to allow the deformable portion to quickly respond in the event of a fault within the device 1.

As described above, the deformable portion 15 would deform in a defined and controlled manner in the event of an increase in internal gas pressure or an increase in temperature in excess of that anticipated under normal working conditions. The deformable portion 15 may be made in a variety of materials, such as metals, graphite, plastics, and may take any suitable form. The material(s) of the deformable portion 15 may be the same as or different from the material(s) of other portions of the upper housing electrode 4.

In an example, the deformable portion 15 may be formed as an integral part of the upper housing electrode 4. Specifically, the deformable portion 15 may be made of the same material (e.g., copper) as other portions of the upper housing electrode 4, and a material removal process (e.g., drilling, milling or turning) may be employed to achieve a reduced thickness at the deformable portion 15. It would be understood that the reduced thickness allows the deformable portion 15 to have a lower resistance to temperature/pressure increase than other portions of the upper housing electrode 4.

Alternatively, the deformable portion 15 may be separately supplied and attached to other portions of the upper housing electrode 4 by, for example, brazing, soldering or welding. In this example, the deformable portion 15 may be made of different material(s) than other portions of the upper housing electrode 4. Further, the deformable portion 15 may be attached to an additional structure (e.g., a frame), which in turn is attached to other portions of the upper housing electrode 4. It would be appreciated that the thickness of the deformable portion 15 may not necessarily be less than the thickness of other portions of the upper housing electrode 4.

In the example illustrated by FIGS. 2 and 3, the outer surface 14 of the upper housing electrode 4 has a hole 12, and the deformable portion 15 is located between the hole 12 and the internal space 11 of the housing. The hole 12 is therefore exposed to the exterior of the device 1. In the event that the deformable portion 15 is made by applying a material removal process on the outer surface 14 of the upper housing electrode 4, the hole 12 represents the volume of the material removed from the upper housing electrode 4. The hole 12 has the same diameter as the deformable portion 15 and a depth (or height) equal to the thickness of the upper housing electrode 4 less the thickness of the deformable portion 15. As shown in FIG. 2, the inner surface 16 of the upper housing electrode 4 is a flat surface, and an inner surface of the deformable portion 15 lies flush with the inner surface 16 of the upper housing electrode 4.

Forming the hole 12 at the outer surface 14 of the upper housing electrode 4 allows the deformable portion 15 to stay closer to the chips 20 as compared to forming the hole 12 at the inner surface 16. This arrangement allows the deformable portion 15 to react faster to a fault of the device 1, which typically causes a temperature increase and/or a pressure increase at/around a faulty chip 20.

As described in more detail below, forming the hole 12 at the outer surface 14 also allows the hole 12 to be used as a mounting hole for use to align the device 1 with an adjacent assembly component in a power electronics system.

Figure 4:
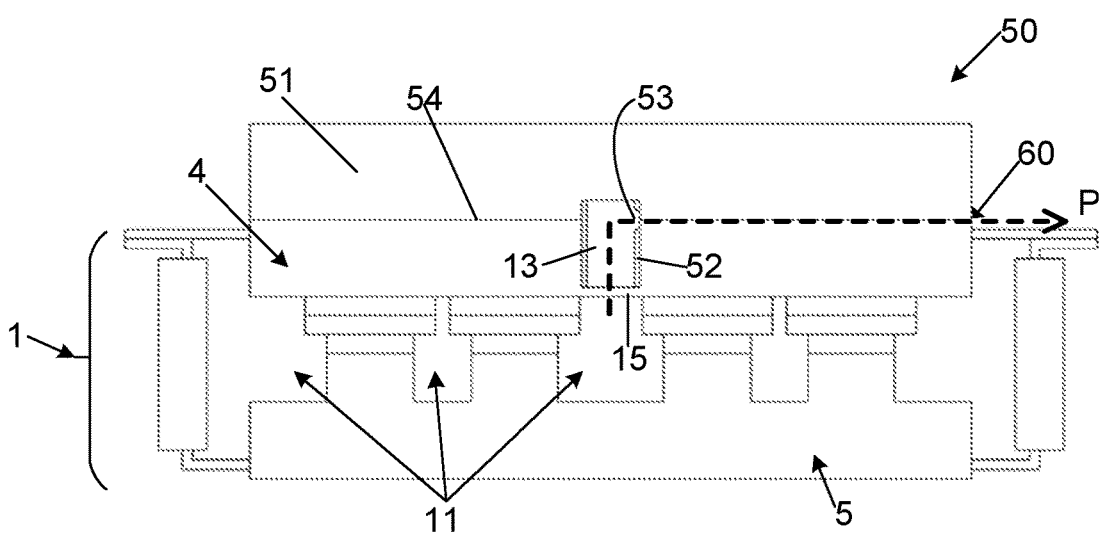
FIG. 4 schematically illustrates a sectional view of a system which incorporates the semiconductor device of FIG. 2.

FIG. 4 schematically illustrates a power electronics system 50 comprising the device 1 and an assembly component 51 arranged at the exterior of the device 1 in the vicinity of the upper housing electrode 4.

The assembly component 51 may be a heat sink for removing heat from the device 1, or a bus bar for conducting current to/from the device 1. In use, the assembly component 51 may be clamped to a housing electrode 4 or 5 of the device 1 so as to achieve a good thermal and/or electrical conductance between the assembly component 51 and the housing electrode 4 or 5. In the example of FIG. 4, a surface of the assembly component 51 contacts the outer surface 14 of the upper housing electrode 4, forming an interface 54 therebetween. The interface 54 is not air tight, thus allowing hot gases vented from the device 1 to pass between the assembly component 51 and the upper housing electrode 4 before being released to the surrounding area of the system 50.

As shown in FIG. 4, a hole 13 extends across the interface 54 into each of the upper housing electrode 4 and the assembly component 51. The hole 13 comprises the hole 12 formed at the outer surface 14 of the upper housing electrode, and a corresponding hole formed at the surface of the assembly component 51. A tube 52 is placed within the hole 13. The tube 52 has a cylindrical side wall and an opening/slot 53 extending through the side wall. The tube 52 may have a diameter which is approximately the same as or slightly less the inner diameter of the hole 13, thereby allowing the tube 52 to tightly fit within the hole 13. The opening 53 is positioned to face the interface 54. Therefore, in the event of a fault within the device 1 which causes the deformable portion 15 to deform, hot gases exiting the device 1 would follow a path P as shown in FIG. 4. The path P originates from the internal space 11, leads through the deformed deformable portion 15 into the tube 52, through the opening 53 into the interface 54 so as to pass between the assembly component 51 and the upper housing electrode 4, and eventually leads to the ambient air at a point 60 located at a periphery of the upper housing electrode 4. In an example, the tube 52 has a diameter of approximately 15 mm. The tube 52 may be made of any suitable material (e.g., metal, plastic etc.) which is able to withstand the temperature of the hot gases emitted from the device 1.

Since the hot gases exiting the device 1 pass between the assembly component 51 and the upper housing electrode 4, the assembly component 51 would effectively cool the hot gases before the gases are released to the surrounding area, thereby rendering the emitted gases less hazardous to neighbouring equipment or personnel. In the event that the assembly component 51 comprises a heat sink (e.g., a water cooled heat sink), the heat sink transfers heat generated by the hot gases to a fluid medium (e.g., water), thereby cooling down the emitted gases from the device 1. In the event that the assembly component 51 comprises a bus bar, the bus bar is typically a large piece of metal plate capable of transmitting significant quantities of current, and, due to its great surface area, can also dissipate heat generated by the hot gases to its surrounding ambient air, thereby cooling the gases.

Further, since the hot gases exiting the device 1 pass through the opening 53 of the tube 52, the particular location of the opening 53 along a circumference of the tube 52 determines an exit direction of the emitted gases into the surrounding area of the system 50. For example, in the example of FIG. 4, the emitted gases are directed to the right-hand side of the system 50. By rotating the tube 52 by half a circle to move the opening 53 to face the left-hand side of the system 50, the emitted gases would be directed to the left-hand side of the system 50. Therefore, the tube 52 and the opening 53 can be used to easily and conveniently guide the gases emitted from the device 1 to a desired location/direction before the gases are released to the surrounding area of the device 1. Therefore, the final point of gas ejection into the surrounding area (e.g., point 60 in FIG. 4) can be suitably designed to differ from the particular location of the deformable portion 15, such that no danger or only a significantly reduced danger is presented by the device 1 to the surrounding area. This greatly expands a user's options with regard to handling the emitted gases.

As described above, the tube 52 acts as a gas guiding tool for guiding the gas emitting from the interior of the device 1 to the surrounding area. Further, the tube 52 may also be used as an aligning tool for aligning the device 1 with the assembly component 51. As shown in FIG. 4, the tube 52 ensures that the hole 12 of the upper housing electrode 4 and the corresponding hole (which is the top part of the hole 13) of the assembly component 51 are aligned, thereby allowing the device 1 to be correctly located with respect to the assembly component 51. In this sense, the hole 12 of the upper housing electrode 4 in which the tube 52 is mounted may also be considered as having dual functions—i.e., an aligning aid (i.e., a mounting hole) and a vent for the release of gases from the internal space 11 of the device 1.

The tube 52 may have multiple openings 53 which allow gases to enter the interface 54 along multiple radial directions. It would further be appreciated that the tube 52 may be omitted from FIG. 4, such that gases ejected through the deformed deformable portion 15 and the hole 12 of the upper housing electrode 4 are forced through the interface 54 between the upper housing electrode 4 and the assembly component 51 along all radial directions. This arrangement may improve the cooling of the emitted hot gases, due to the increased contact area between the gases and the assembly component 51.

FIG. 3 shows that the deformable portion 15 and the hole 12 are located at the centre of the upper housing electrode 4 in the top plan view of the device 1. This centred arrangement provides several advantages. Firstly, it allows the deformable portion 15 to be within a reasonable distance to each of the chips 20, thereby allowing the deformable portion 15 to react at a reasonable speed to a fault of any chip 20. Secondly, because the hole 12 accommodates the tube 52 which is an aligning tool, the centred arrangement allows the centre of the device 1 to be aligned with the centre of the assembly component 51. In use, the assembly component 51 makes contact with the upper housing electrode 4 of the device 1 typically on the application of a force by an external clamping system. With the centre of the device 1 aligned with the centre of the assembly component 51, the clamping system can easily create an even distribution of pressure between the assembly component 51 and the device 1. The even distribution of pressure advantageously leads to even distributions of thermal conductance and electrical conductance between the assembly component 51 and the upper housing electrode 4. Despite the advantages described above, it would however be understood that the centred arrangement of the deformable portion 15 and/or the hole 12 is not essential and that the deformable portion 15 and/or the hole 12 may be provided at other suitable locations of the upper housing electrode 4.

Figure 5:
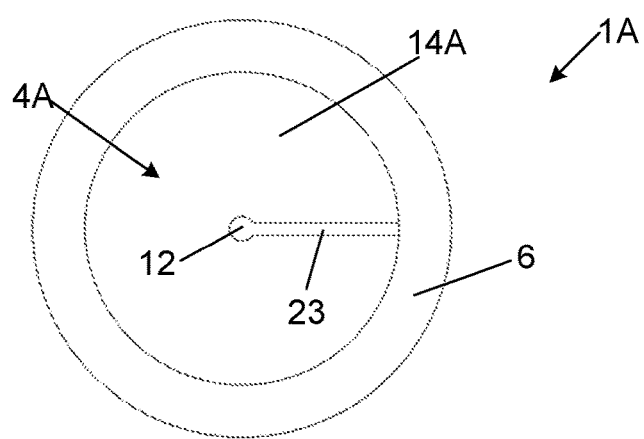
FIG. 5 schematically illustrates a plan view of a semiconductor device according to a second embodiment of the present disclosure.

In the system illustrated by FIG. 4, the gases emitted from the device 1 pass between the interface 54 between the assembly component 51 and the upper housing electrode 4. A gas channel may be formed at the interface 54 to direct the emitted gases to the ambient air. FIG. 5 schematically illustrates the top plan view of a semiconductor device 1A according to a second embodiment of the present disclosure. Elements of the device 1A that are identical to those of the device 1 are identified using the same labels. Elements of the device 1A that correspond to, but are different from those of the device 1 are labelled using the same numerals but with a letter 'A' for differentiation. The features and advantages described above with reference to the first embodiment are generally applicable to the second embodiment.

As shown in FIG. 5, the device 1A comprises an upper housing electrode 4A which has an outer surface 14A exposed to an exterior of the device 1A. The outer surface 14A comprises a hole 12 and a groove 23. Similar to the first embodiment as shown in FIGS. 2 and 3, a deformable portion 15 (not shown) is located between the hole 12 and the internal space 11 (not shown) of the device 1A, and the hole 12 is exposed to the exterior of the device 1A. The groove 23 is joined to the hole 12 and extends between the hole 12 and a periphery of the upper housing electrode 4A. Therefore, when the device 1A is in contact with the assembly component 51 of FIG. 4, the hole 12 and the groove 23 collectively form a gas guiding channel for directing gases emitted from the interior of the device 1A to the surrounding area of the device 1A. The final point of gas ejection into the surrounding area is at the outer end of the groove 23. Therefore, a path of the groove 23 on the outer surface 14A of the upper housing electrode 4A determines an exit path/direction of the emitted gases.

The path of the groove 23 may be suitably designed such that the final point of gas ejection is at a location which minimises the danger presented to nearby equipment and personnel. Further, while FIG. 5 shows a single, straight, groove 23, it would be appreciated that there may be more than one groove on the outer surface 14A, and each groove may take any suitable shape. For example, a groove may wind around the hole 12 so as to have a longer length, thereby more efficiently cooling the emitted gas.

It would also be understood that the groove 23 may be alternatively provided on a surface of the assembly component 51 which faces the device 1A (e.g., the bottom surface of the assembly component 51 as shown in FIG. 4). Further, each of the upper housing electrode 4A and the assembly component 51 may comprise a groove, and when the assembly component 51 makes contact with the upper housing electrode 4A, the two grooves collectively form a gas guiding channel between the assembly component 51 and the upper housing electrode 4A.

Figure 6:
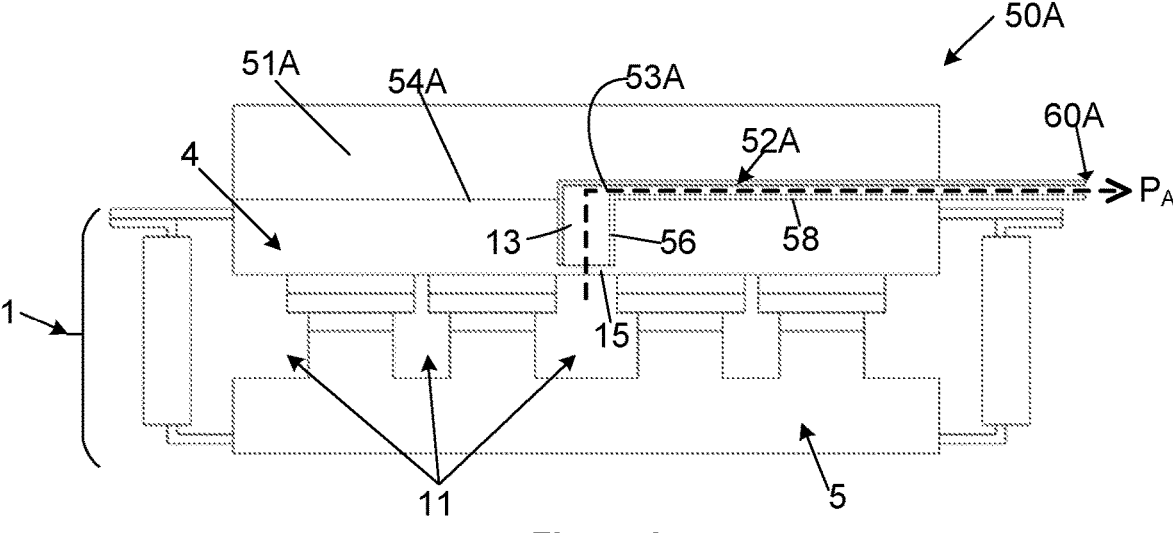
FIG. 6 schematically illustrates a sectional view of an alternative system which incorporates the semiconductor device of FIG. 2.

In addition, a tube may be provided within the gas guiding channel defined by the hole 12 and the groove 23. FIG. 6 schematically illustrates a power electronics system 50A according to a second embodiment of the present disclosure. Elements of the system 50A that are identical to those of the system 50 are identified using the same labels. Elements of the system 50A that correspond to, but are different from those of the system 50 are labelled using the same numerals but with a letter 'A' for differentiation. The features and advantages described above with reference to the first embodiment are generally applicable to the second embodiment.

The power electronics system 50A comprises the device 1 as shown in FIGS. 2 and 3 and an assembly component 51A arranged at the exterior of the device 1 in the vicinity of the upper housing electrode 4.

The assembly component 51A differs from the assembly component 51 of FIG. 4 in that it comprises a groove on its bottom surface which faces the device 1. As a result, when the assembly component 51A makes contact with the device 1, the interface 54A between the assembly component 51A and the device 1 is such that the assembly component 51A does not directly contact the upper housing electrode 4 at the location of the groove, but contacts the upper housing electrode 4 at other locations.

The groove of the assembly component 51A is connected with a hole 13 which extends across the interface 54A. A bent tube 52A which is generally L-shaped is placed within the hole 13 and the groove. The bent tube 52A may be considered as having two perpendicular sections 56, 58 joined together. The first section 56 resembles the tube 52 of FIG. 4, and has an opening 53A extending through its side wall. The second section 58 extends along a direction perpendicular to the first section 56, and is located between the assembly component 51A and the upper housing electrode 4. In the event of a fault within the device 1 which causes the deformable portion 15 to deform, hot gases exiting the device 1 would follow a path PA as shown in FIG. 6. The path PA originates from the internal space 11, leads through the deformed deformable portion into the tube 52A, through the tube 52A so as to pass between the assembly component 51A and the upper housing electrode 4, and eventually leads to the ambient air at a point 60A located at the outer end of the tube 52A.

Similar to the tube 52, the tube 52A is adapted for dual use as both an aligning tool for aligning the device 1 with the assembly component 51A, and a gas guiding tool for guiding the gas emitting from the interior of the device 1 to the surrounding area.

While FIGS. 2 to 6 show a single deformable portion, it would be appreciated that this is merely for conceptual clarity and the upper housing electrode 4 may contain any suitable number of deformable portion(s) 15. Further or alternatively, the deformable portion(s) 15 may be formed within the lower housing electrode 5. For example, the outer surface 18 of the lower housing electrode 5 may have a hole similar to the hole 12, and a deformable portion similar to the portion 15 may be located between the hole and the internal space 11 of the housing. The lower housing electrode 5 may be coupled to an assembly component (e.g., the assembly component 51 or 51A) to achieve similar effects to those described above with reference to FIGS. 4 and 6.

As described above, providing the deformable portion 15 in one or more of the housing electrodes 4, 5 allows hot gases emitted from the interior of the housing to be easily cooled down before the gases are released to the surrounding area, thereby rendering the emitted gases less hazardous. This may be achieved by, for example, re-using an existing assembly component (e.g., the assembly component 51 or 51A) which is commonly associated with the housing electrode.

Further, providing the deformable portion 15 in the housing electrode allows a user to easily and conveniently guide the gases emitted from the interior of the housing to a desired location/direction. This may be achieved by forming a groove (e.g., the groove 23) on a surface of the housing electrode and/or a surface of an adjacent assembly component, and/or by placing a tube (e.g., the tube 52 or 52A) as a gas guiding device between the housing electrode and its adjacent assembly component. Therefore, the final point of gas ejection (e.g., points 60 and 60A) into the surrounding area may be suitably designed to differ from the particular location of the deformable portion 15, such that no danger or only a significantly reduced danger is presented by the device 1, 1A to the surrounding area. This greatly expands a user's options with regard to handling the emitted gases.

In contrast, in prior designs where a deformable portion is formed within the lid flange 6 or the electrical insulator 8, hot gases emitted from the device would be directly released to the surrounding area without being cooled down first. This brings safety concerns to neighbouring equipment and personnel. Further, the locations of the deformable portion in the prior designs make it very difficult to reliably couple the deformable portion to a gas guiding structure so as to guide the emitted gases away from the device, and thus the final point of gas ejection would often be the same as the location of the deformable portion. This severely limits the user's option with regard to handling the emitted gas.

In the device 1 as shown in FIGS. 2, 4 and 6, the housing electrodes 4, 5 are used as a means of applying pressure to the semiconductor units 30. Alternatively, a different means of applying pressure, such as a spring mechanism, may be used.

While FIGS. 2 to 6 relate to multi-chip press-pack power semiconductor devices, it would be appreciated that the deformable portion 15 may equally be used in the design of any semiconductor device for which explosive rupturing of its hermetic housing is of concern.

FIG. 7 schematically illustrates processing steps of a method for manufacturing a semiconductor device (e.g., the device 1 or 1A).

At step S1, a housing is provided. The housing comprises a housing electrode (e.g., the housing electrode 4, 4A or 5).

The housing electrode comprises a deformable portion (e.g., the deformation portion 15). The deformable portion is designed to deform when a pressure difference between an interior and an exterior of the housing exceeds a threshold differential pressure or a temperature at the deformable portion exceeds a threshold temperature, so as to transform the housing from a hermetically sealed housing to an open housing in fluid communication with the exterior.

At step S2, at least one semiconductor chip (e.g., the chips 20) are arranged inside the housing.

It would be appreciated that the steps may be performed in a temporal order that is different from the order of description. For example, step S1 may comprise two sub-steps, which provide a first part and a second part of the housing, respectively, and step S2 may be performed between the two sub-steps such that the at least one semiconductor chip is arranged within the housing.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The skilled person will understand that in the preceding description and appended claims, positional terms such as 'upper', 'lower', 'top', 'bottom', 'left', 'right' etc. are made with reference to conceptual illustrations of a semiconductor device, such as those showing standard sectional views and those shown in the appended drawings. These terms are used for ease of reference but are not intended to be of limiting nature. These terms are therefore to be understood as referring to a semiconductor device when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

The invention claimed is:

1. A system comprising:
a semiconductor device comprising:
   a housing comprising a housing electrode;
   at least one semiconductor chip arranged within the housing, wherein the housing electrode comprises a deformable portion, and the deformable portion is configured to deform when a pressure difference between an interior and an exterior of the housing exceeds a threshold differential pressure or a temperature at the deformable portion exceeds a threshold temperature, so as to transform the housing from a hermetically sealed housing to an open housing in fluid communication with the exterior;
an assembly component arranged at the exterior of the semiconductor device in the vicinity and being in contact with an outer surface of the housing electrode of the semiconductor device, wherein the assembly component, the housing electrode and the at least one semiconductor chip are arranged along a first direction perpendicular to the outer surface of the housing electrode, the housing electrode being arranged between the assembly component and the at least one semiconductor chip along the first direction; and
wherein the assembly component and the housing electrode are configured such that gas emitted from the interior to the exterior of the housing follows a path which leads through the deformed deformable portion and passes between the assembly component and the housing electrode, and wherein the assembly component is configured to cool the gas before the gas is released to a surrounding area of the system.

2. A system according to claim 1, wherein the housing electrode comprises an inner surface facing the interior of the housing, and an opposing outer surface, and wherein the outer surface comprises a hole, the deformable portion being arranged between the hole and the interior of the housing, and
   wherein the assembly component comprises a first surface facing the semiconductor device, the first surface comprising a groove extending from the hole to a periphery of the assembly component.

3. A system according to claim 1, wherein the housing electrode comprises an inner surface facing the interior of the housing, and an opposing outer surface, and wherein the outer surface comprises a hole, the deformable portion being arranged between the hole and the interior of the housing, and wherein the system further comprises a tube, at least a part of which is located within the hole.

4. A system according to claim 3, wherein the tube is configured to direct gas emitted from the interior of the housing to flow, along a predetermined direction or path, between the assembly component and the housing electrode.

5. A system according to claim 3, wherein the tube comprises a side wall and an opening extending through the side wall, and wherein the opening is positioned to allow gas emitted from the interior of the housing to flow, via the opening, into an interface between the assembly component and the housing electrode.

6. A system according to claim 1, wherein the assembly component comprises a heat sink or a bus bar.

7. A system according to claim 1, wherein the semiconductor device is a power semiconductor device, and the system is a power electronics system.

8. A system according to claim 1, wherein the deformable portion has a resistance to at least one of a pressure increase and a temperature increase that is less than other portions of the housing.

9. A system according to claim 1, wherein the deformable portion has a circular disk shape.

10. A system according to claim 1, wherein the deformable portion has a thickness which is less than other portions of the housing electrode.

11. A system according to claim 1, wherein the deformable portion is arranged at the center of the housing electrode.

12. A system according to claim 1, wherein the housing electrode comprises an inner surface facing the interior of the housing, and opposing the outer surface, and wherein the outer surface comprises a hole, the deformable portion being arranged between the hole and the interior of the housing.

13. A system according to claim 12, wherein the hole is arranged at the center of the outer surface of the housing electrode.

14. A system according to claim 12, wherein the outer surface of the housing electrode further comprises a groove extending from the hole to a periphery of the housing electrode.

15. A system according to claim 1, wherein:

the housing electrode is a first housing electrode, and the housing further comprises a second housing electrode and an electrical insulator arranged between the first and second housing electrodes;

the first and second housing electrodes are located at opposite sides of the housing; and the second housing electrode comprises a further deformable portion.

16. A system according to claim 1, further comprising a gas guiding channel arranged between the housing electrode and the assembly component and extending from the deformable portion to a periphery of the housing electrode.

17. A system according to claim 16, wherein the gas guiding channel is parallel to the outer surface of the housing electrode.

18. A method of assembling a system comprising a semiconductor device, the method comprising:

providing a housing of the semiconductor device, wherein the housing comprises a housing electrode;

arranging at least one semiconductor chip of the semiconductor device within the housing;

clamping an assembly component to the housing electrode such that the assembly component is in contact with an outer surface of the housing electrode, the assembly component being arranged at an exterior of the semiconductor device, wherein the assembly component, the housing electrode and the at least one semiconductor chip are arranged along a first direction perpendicular to the outer surface of the housing electrode, the housing electrode being arranged between the assembly component and the at least one semiconductor chip along the first direction;

wherein the housing electrode comprises a deformable portion, and the deformable portion is configured to deform when a pressure difference between an interior and an exterior of the housing exceeds a threshold differential pressure or a temperature at the deformable portion exceeds a threshold temperature, so as to transform the housing from a hermetically sealed housing to an open housing in fluid communication with the exterior; and wherein the assembly component and the housing electrode are configured such that gas emitted from the interior to the exterior of the housing follows a path which leads through the deformed deformable portion and passes between the assembly component and the housing electrode, and wherein the assembly component is configured to cool the gas before the gas is released to a surrounding area of the system.

19. The method of claim 18, wherein the housing electrode comprises an inner surface facing the interior of the housing, and opposing the outer surface, and wherein the outer surface comprises a hole, the deformable portion being arranged between the hole and the interior of the housing, and wherein the method further comprises aligning the semiconductor device with the assembly component by using the hole as a mounting hole.

\* \* \* \* \*